United States Patent
Perner et al.

(10) Patent No.: US 7,180,770 B2
(45) Date of Patent: Feb. 20, 2007

(54) SERIES DIODE THERMALLY ASSISTED MRAM

(75) Inventors: Frederick A. Perner, Santa Barbara, CA (US); Janice Nickel, Sunnyvale, CA (US); Lung Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/089,688

(22) Filed: Mar. 24, 2005

(65) Prior Publication Data

US 2006/0215444 A1    Sep. 28, 2006

(51) Int. Cl.
*G11C 11/02* (2006.01)
(52) U.S. Cl. .................... 365/158; 365/171; 365/55
(58) Field of Classification Search .............. 365/55
See application file for complete search history.

(56) References Cited

U.S. PATENT DOCUMENTS

| | | | | |
|---|---|---|---|---|
| 3,810,127 A | * | 5/1974 | Hoff, Jr. .................... 365/96 |
| 5,793,697 A | * | 8/1998 | Scheuerlein ........... 365/230.07 |
| 5,838,608 A | * | 11/1998 | Zhu et al. ................... 365/158 |
| 5,991,193 A | * | 11/1999 | Gallagher et al. ........... 365/171 |
| 6,191,972 B1 | * | 2/2001 | Miura et al. ................. 365/171 |
| 6,522,573 B2 | * | 2/2003 | Saito et al. .................. 365/158 |
| 6,678,189 B2 | * | 1/2004 | Tran ........................... 365/171 |
| 6,912,153 B2 | * | 6/2005 | Tihanyi ....................... 365/158 |
| 6,927,996 B2 | * | 8/2005 | Eaton et al. ................. 365/171 |
| 2003/0218905 A1 | * | 11/2003 | Perner et al. ................ 365/173 |
| 2004/0160801 A1 | * | 8/2004 | Krieger et al. .............. 365/151 |
| 2005/0174828 A1 | * | 8/2005 | Sharma ...................... 365/141 |

* cited by examiner

*Primary Examiner*—Tan T. Nguyen

(57) ABSTRACT

An information storage device is provided. The information storage device may be a magnetic random access memory (MRAM) device including a resistive cross point array of spin dependent tunneling (SDT) junctions or magnetic memory elements, with word lines extending along rows of the SDT junctions and bit lines extending along the columns of the SDT junctions. The present design includes a plurality of heating elements connected in series with associated magnetic memory elements, each heating element comprising a diode. Voltage applied to a magnetic memory element and associated heating element causes reverse current to flow through the diode, thereby producing heat from the diode and heating the magnetic memory element, thereby facilitating the write function of the device.

27 Claims, 4 Drawing Sheets

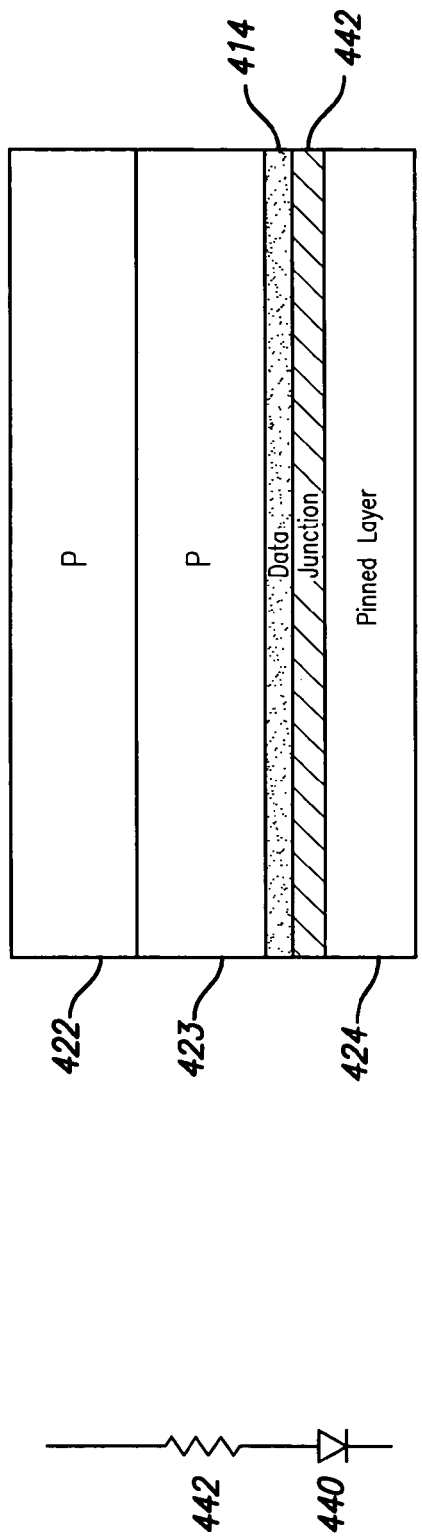
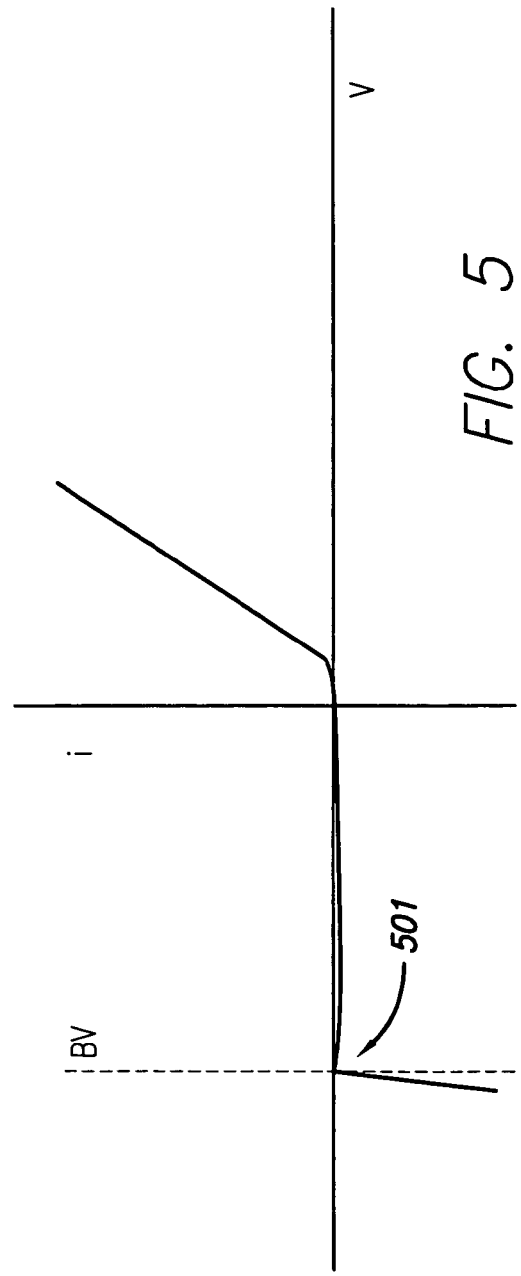
FIG. 4B
FIG. 4A
FIG. 5

SERIES DIODE THERMALLY ASSISTED MRAM

BACKGROUND OF THE INVENTION

1. Field of the Invention

The present invention relates generally to the field of information storage devices, and more particularly to the magnetic random access memory (MRAM) devices and thermal properties associated therewith.

2. Description of the Related Art

Magnetic Random Access Memory, or MRAM, is a non-volatile memory that may be employed for both short term and long term data storage. One implementation of an MRAM device includes a resistive cross point array of spin dependent tunneling (SDT) junctions, with word lines extending along rows of the SDT junctions and bit lines extending along the columns of the SDT junctions. Each SDT junction is located at a cross point of a word line and a bit line. The magnetization of each SDT junction assumes one of two stable orientations at any given time. These two stable orientations, parallel and anti-parallel, represent logic values of '0' and '1.' The magnetization orientation, in turn, affects the resistance of the SDT junction. Resistance of the SDT junction is a first value (R) when the magnetization orientation is parallel and a second value (R+ΔR) when the magnetization orientation is anti-parallel. The magnetization orientation of the SDT junction and its logic value may be read by sensing its resistance state.

An MRAM using the foregoing SDT junction design performs a write operation on a selected SDT junction by supplying write currents to the word and bit lines crossing the selected SDT junction. The currents create two external magnetic fields that, when combined, switch the magnetization orientation of the selected SDT junction from parallel to anti-parallel or vice versa.

Too small a write current might not cause the selected SDT junction to change its magnetization orientation. In theory, both external fields combined should be sufficient to flip the magnetization orientation of the selected SDT junction. In practice, however, the combined magnetic fields do not always flip the magnetization orientation. If the magnetization orientation of the selected SDT junction is not flipped, a write error is made and an increased burden on error code correction can result.

Heating the MRAM to enable thermally assisted switching of the MRAM device may assist in performing the write operation. Different procedures for heating the MRAM cell have been employed with varying effectiveness. One such method comprises heating the entire MRAM using an external heat source. Problems with this heating method include nonselective heating, including heating components that do not enhance thermal assisted switching and the write process. An external heater is not practical for many applications, and typically requires very high external temperatures. Thermal time constants associated with external heating also tend to be relatively long, resulting in slow overall operation of the device.

Other memory architectures encounter self heating when the system selects the particular cell. However, the magnitude of the power generated from self-heating is generally insufficient to enhance the write operation in any material way. A more significant voltage drop across the selected MRAM cell may enhance writing.

It would be advantageous to provide efficient heating of SDT junction MRAM memory cells, specifically heating that efficiently enhances writing capabilities and avoids the problems associated with previous designs.

SUMMARY OF THE INVENTION

According to one aspect of the present design, there is provided an information storage device comprising an array of magnetic memory elements and a plurality of heating elements, each heating element connected in series with one magnetic memory element, each heating element comprising a diode. Application of voltage in excess of diode breakdown voltage to one magnetic memory element causes reverse current to flow through the diode, thereby heating said one magnetic memory element.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which:

FIG. 4A shows a representation of a diode and resistor connected to each SDT junction in the present design;

FIG. 4B illustrates the layers employed in construction of the diode and resistor combination of FIG. 2A; and FIG. 5 illustrates a current-voltage curve including breakdown voltage for the diode.

DETAILED DESCRIPTION OF THE INVENTION

The present invention is a series diode thermally assisted MRAM device formed by integrating a thin film junction diode in series with a tunnel junction MRAM memory cell. During data storage, the MRAM device performs thermally assisted switching of selected memory elements using thin film junction diodes connected to the SDT junction in series. Thermally assisted switching using a thin film junction diode in series with a tunnel junction MRAM memory cell improves the reliability data storage in the MRAM device. Such thermally assisted switching also enables the employment of smaller devices having higher densities and using lower currents.

A magnetic memory element of the MRAM device could be any element having a resistance that is dependent upon the state of its magnetic film. Examples of such elements include magnetic tunnel junctions, where the SDT junction is a type of magnetic tunnel junction. Other types of magnetic memory elements include giant magnetoresistance ("GMR") spin valves. For the purposes of illustration, the memory elements will be described herein with respect to and as SDT junctions.

Figure 1:
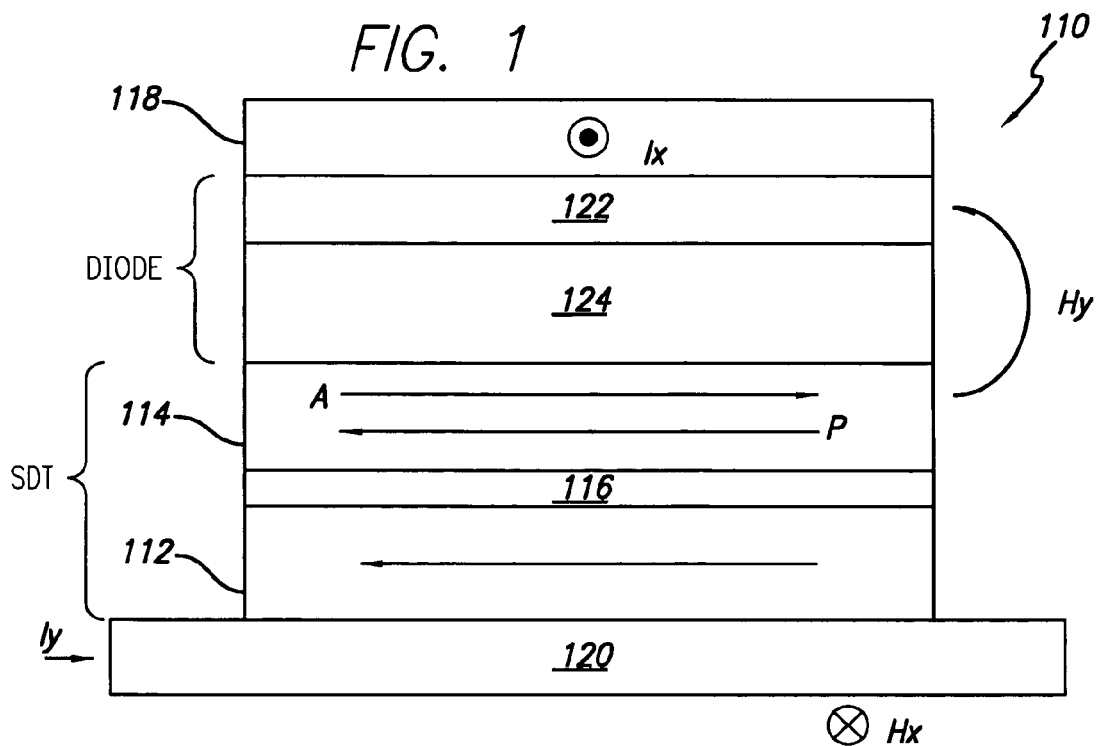
FIG. 1 illustrates construction of a typical SDT junction or magnetic memory element.

FIG. 1 shows an SDT junction 110. The SDT junction 110 includes a pinned layer 112 having a magnetization that is oriented in the plane of the pinned layer 112 but fixed so as not to rotate in the presence of an applied magnetic field in a range of interest. The SDT junction 110 also includes a "free" layer 114 having a magnetization orientation that is not pinned. Rather, the magnetization can be oriented in either of two directions along an axis (the "easy" axis) lying in the plane of the free layer 114. If the magnetization of the pinned and free layers 112 and 114 are in the same direction, the orientation is said to be "parallel" as indicated by the arrow P. If the magnetization of the pinned and free layers 112 and 114 are in opposite directions, the orientation is said to be "anti-parallel" as indicated by the arrow A.

The pinned and free layers 112 and 114 are separated by an insulating tunnel barrier 116. The insulating tunnel barrier 116 allows quantum mechanical tunneling to occur between the pinned and free layers 112 and 114. This tunneling phenomenon is electron spin dependent, making the resistance of the SDT junction 110 a function of the relative orientations of the magnetization of the pinned and free layers 112 and 114. For instance, resistance of the SDT junction 110 is a first value (R) if the magnetization orientation of the pinned and free layers 112 and 114 is parallel and a second value (R+ΔR) if the magnetization orientation is anti-parallel.

Magnetic fields (Hx, Hy) may be applied to the SDT junction 110 by supplying currents (Iy, Ix) to first and second conductors 118 and 120 contacting the SDT junction 110. If the conductors 118 and 120 are orthogonal, the applied magnetic fields (Hx, Hy) will also be orthogonal.

When sufficiently large currents (Ix, Iy) pass through the conductors 118 and 120, the combined magnetic field (Hy+Hx) in the vicinity of the free layer 114 causes the magnetization of the free layer 114 to rotate from the parallel orientation the anti-parallel orientation, or vice-versa. For example, currents Iy in combination with Ix can be employed to switch the bit, or a current Iy in combination with a negative current −Ix can be used to switch the bit.

Figure 2A:
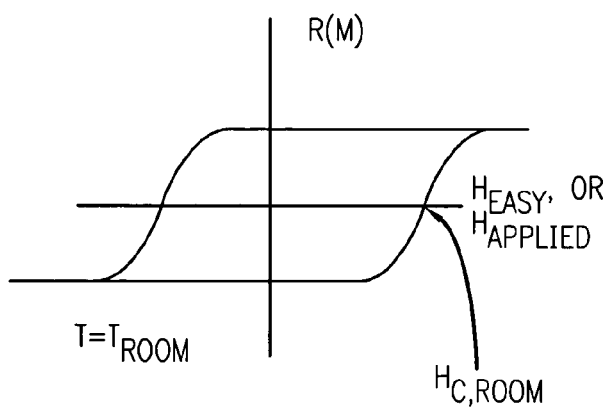
FIG. 2A illustrates a hysterisis loop for coercivity at room temperature.
Figure 2B:
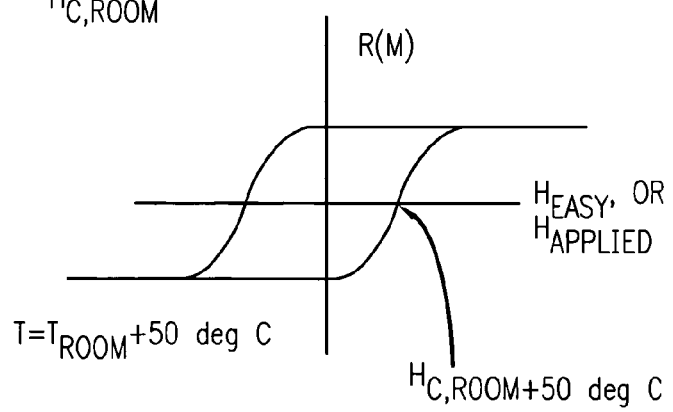
FIG. 2B is a hysterisis loop for coercivity at 50 degrees C above room temperature.

Current magnitudes may be selected so that the combined magnetic field (Hx+Hy) exceeds the switching field of the free layer 114 but does not exceed the switching field of the pinned layer 112. However, the magnitude of one or both write currents (Ix, Iy) may be reduced if the SDT junction 110 is heated. Coercivity of a magnetic film decreases with increasing temperature. Raising the temperature of the SDT junction 110 reduces the coercivity (Hc) of the SDT junction 110, as shown in FIGS. 2A and 2B. FIG. 2A shows the coercivity (Hc) at room temperature, while FIG. 2B shows the coercivity (Hc) at 50 degrees C. above room temperature. Hc represents the intersection of the loop shown in FIGS. 2A and 2B with Happlied, or the applied magnetic field. At the elevated temperature, the SDT junction 110 switches from a high resistance state to a low resistance state and vice-versa in the presence of a lower combined magnetic field (Hx+Hy). Hy reduces Hc in the "easy," or opposite, direction as well. Therefore, heating the SDT junction 110 allows the magnitudes of one or both of the write currents (Ix, Iy) to be reduced. Alternatively, if magnitudes of the write currents (Ix, Iy) are not reduced, the SDT junction 110 will switch more reliably in the presence of the combined magnetic field (Hx+Hy). The temperature and write current can be varied to achieve a desired switching reliability.

The free layer 114 may be heated to about 10 degrees C. to 50 degrees C. above ambient. More generally, the maximum heating temperature may be about 50 degrees C. less than the Blocking temperature $T_B$ (the temperature above which the anti-ferromagnetic layer loses its pinning properties).

Figure 3A:
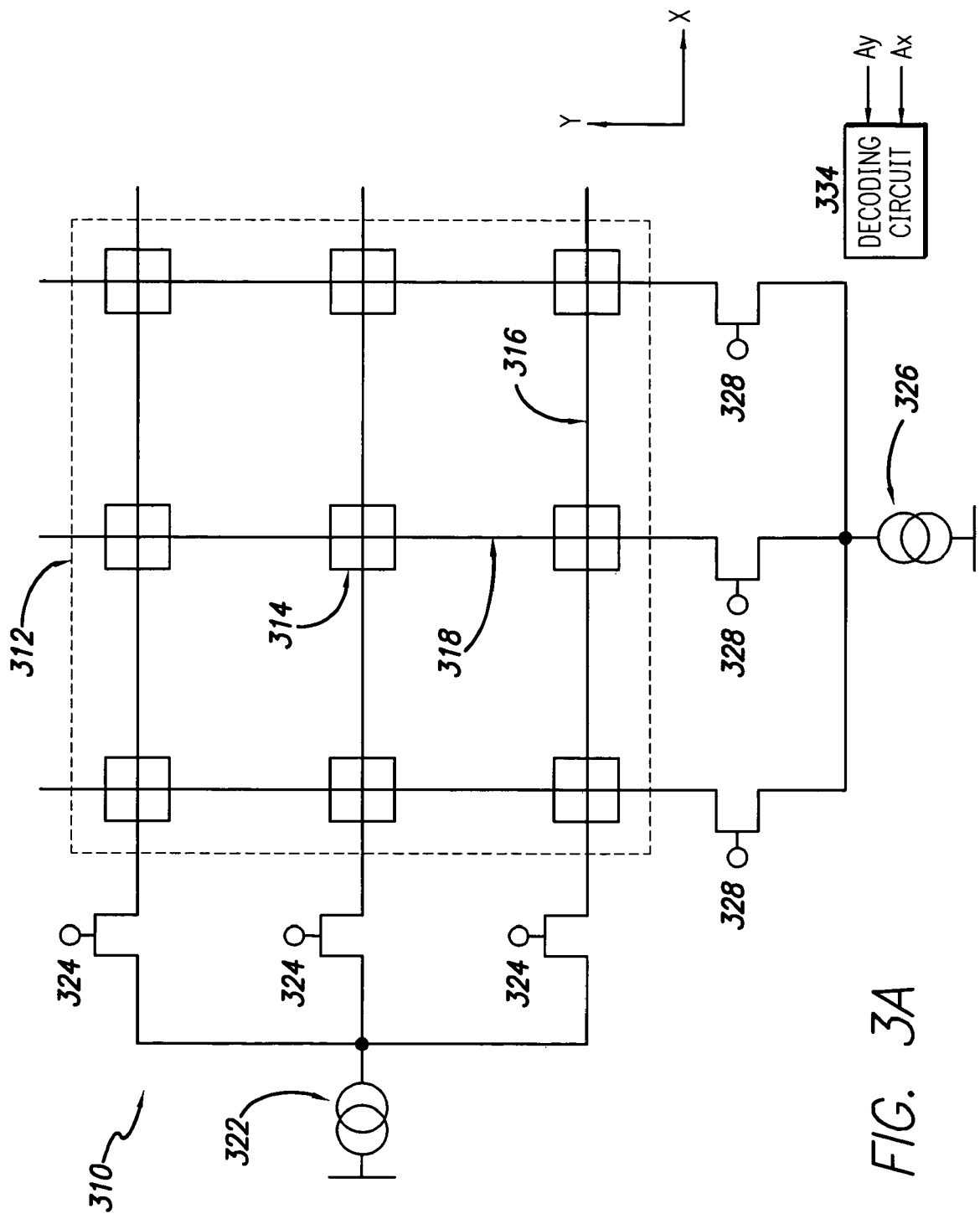
FIG. 3A illustrates the SDT junction or magnetic memory element array employed in the current design.

FIG. 3A illustrates an information storage device 310 including a resistive cross point array 312 of memory elements 314. The memory elements 314 are arranged in rows and columns, with the rows extending along an x-direction and the columns extending along a y-direction. Only a relatively small number of memory elements 314 is shown to simplify the illustration of the information storage device 310. In practice, arrays of any size may be used.

Traces functioning as word lines 316 extend along the x-direction in a plane on one side of the memory cell array 312. Traces functioning as bit lines 318 extend along the y-direction in a plane on an adjacent side of the memory cell array 312. One word line 316 may exist for each row of the array 312 and one bit line 318 for each column of the array 312. Each memory element 314 is located at a cross point of a word line 316 and a bit line 318.

The information storage device 310 includes a read circuit for sensing the resistance states of selected memory elements 314 during read operations and a write circuit for supplying write currents to selected word lines 316 and bit lines 318 during write operations. The read circuit is not shown in order to simplify the illustration of the information storage device 310.

The write circuit includes a first current source 322 coupled to the word lines 316 by a first group of transistors 324, a second current source 326 coupled to the bit lines 318 by a second group of transistors 328.

During a write operation, a decoder 334 decodes addresses Ax and Ay to select a word line 316 and a bit line 318. The decoder 334 selects a word line 316 by commanding a transistor 324 of the first group to connect the word line 316 to the first current source 322 and a bit line 318 by commanding a transistor 328 of the second group to connect the bit line 318 to the second current source 326. Currents flow through the selected word and bit lines 316 and 318. The memory element 314 at the crosspoint of the selected word and bit lines 316 and 318 is exposed to the combined magnetic field (Hx+Hy).

FIG. 3A shows a single current source 322 for the word lines 316 and a single current source 326 for the bit lines 318. In large arrays, multiple current sources 322 may be provided for the word lines 316 and multiple current sources 326 may be provided for the bit lines 318, whereby each current source 322 is shared by multiple word lines 316 and each current source 326 is shared by multiple bit lines 318. This allows simultaneous writes to multiple memory elements 314.

Other elements of the write circuit are not shown. For example, FIG. 3A does not show transistors for connecting "free ends" of the word and bit lines 316 and 318 to a reference potential. Moreover, the transistors 324 and 328 and current sources shown in FIG. 3A are a simplification of the write circuit. Circuitry for supplying current to word and bit lines 316 and 318 may be implemented in a variety of different ways.

Figure 3B:
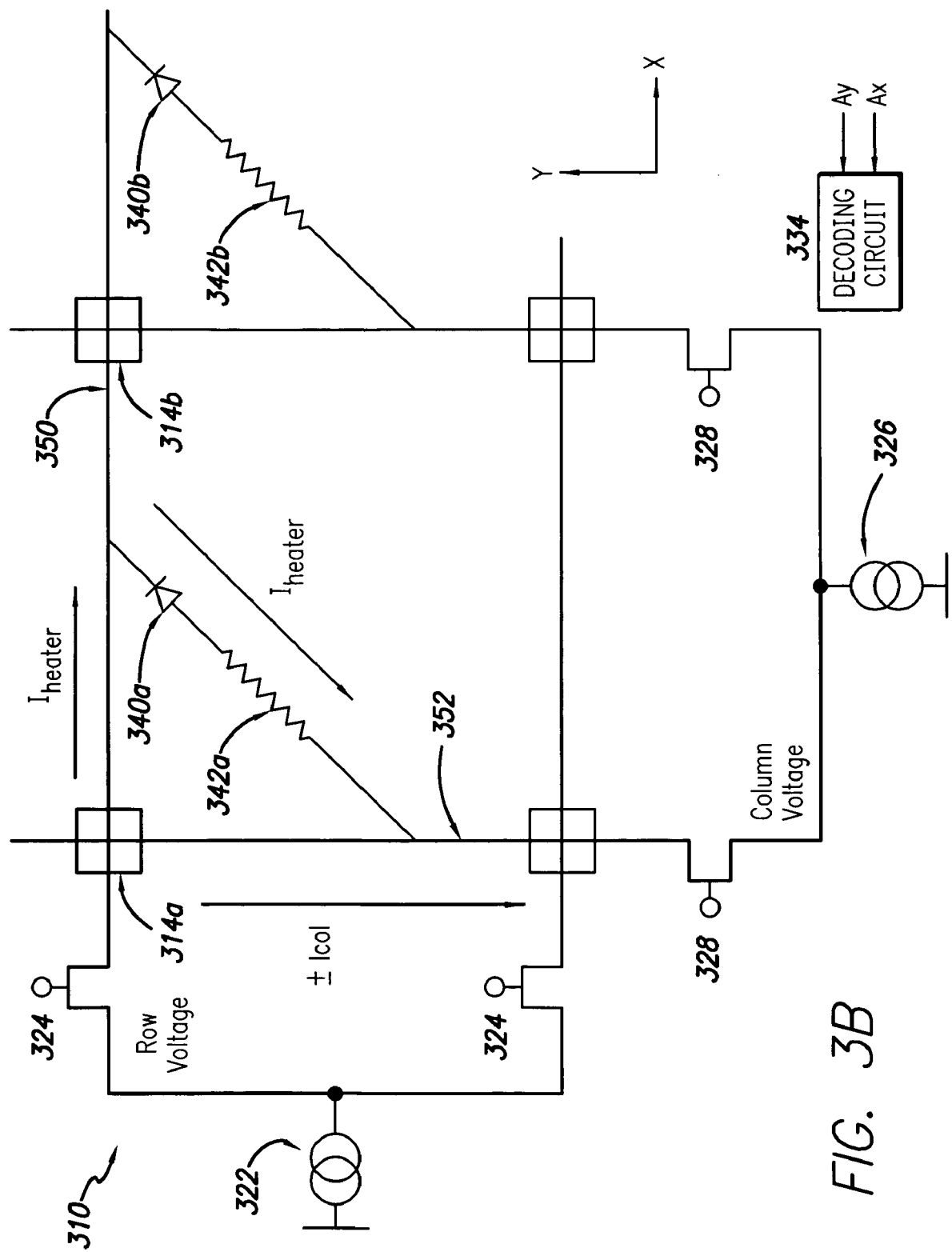
FIG. 3B shows the array with heating element wherein one element is selected, voltage applied to the selected element, and heat produced due to the passage of reverse current through the heating element.

The heating of the write circuit is presented in detail in FIG. 3B. Heating of the magnetic memory element 314a occurs by applying reverse current through one diode 340a in series with an SDT 342a where an SDT junction is represented as resistor 342a, and where the remaining diodes in the information storage device 310 are not shown.

The heating structure comprises a thin film junction diode connected in series with an SDT memory cell. The reverse bias breakdown voltage is specifically selected to heat the selected MRAM cell and assist the write operation. Reverse application of current through the diode in the arrangement shown produces sufficient heat which, in addition to the self heating of the MRAM SDT or magnetic memory element 314a, can enable more efficient writing and enhanced coercivity.

As shown in FIG. 3B, write element 314a may be selected by applying voltage along row wire 350 and along column wire 352. Only the selected write element is heated, primarily by the series diode 340a, when reverse current is forced through the magnetic memory element 314a, and the heating element formed by diode 340a and resistor 342a. Self heating occurs within the magnetic memory element 314a itself when voltage is applied. The amount of self-heating generated is equal to the square of the current flowing through diode 340a and resistor 342a multiplied by the resistance of the tunnel junction magnetic memory element 314a. Heater current generally only flows through the reverse biased diode 340a if applied voltage exceeds the diode breakdown voltage. Power dissipated in the form of heat from the diode 340a is equal to the product of the diode breakdown voltage, when operating at the diode breakdown voltage, multiplied by the current passing through the diode 340a and resistor 342a. In operation, current flows along row wire 350, back through diode 340a, through resistor 342a, and to column wire 352. Only the selected cell is heated in this configuration, and heater current will only flow through the reversed bias diode, such as diode 340a, when applied voltage is greater than the diode breakdown voltage. In the arrangement shown in FIGS. 3A and 3B, the components illustrated may be aligned in a substantially planar orientation, thereby saving space and enabling stacking multiple layers of memory components.

FIG. 3B illustrates the additional heating element indicated by diode 340b and resistor 342b, associated with magnetic memory element 314b. As the row and column for magnetic memory element 314b are not selected, breakdown voltage for diode 340b is not achieved and heat is not provided by the heating element.

In the arrangement shown in FIGS. 3A and 3B, application of write select voltages and currents cause only the selected MRAM write element to be heated. Application of heat in the manner described by the selected MRAM write element in combination with the series diode lowers the easy axis coercivity of the MRAM element and eliminates the need for a second write conductor isolated from the combined MRAM and diode structure. The primary heat source in the magnetic memory element is enabled by the PN junction, specifically the diode, where heat generated by the diode reverse breakdown voltage multiplied by the diode reverse current flows through the diode-resistor combination.

FIG. 4A illustrates a representative series diode 440 coupled to a resistor 442, while FIG. 4B illustrates the layered implementation of the series diode 440 coupled to resistor 442, where diode 440 is a thin film diode. Layers 422 and 423 represent P and N layers, respectively, while layer 414 is the data layer of the magnetic memory element. Layers 422 and 423 may be exchanged to form a NP diode. Layer 442 represents the SDT junction. An alternate embodiment may include a top pinned structure. A top pinned structure will generally be arranged in a stack similar to the structure of FIG. 4B, with the order of the layers will be reversed. From top to bottom, the layers in such a top pinned structure are 424-442-414-423-422.

The voltage versus current curve for the arrangement of FIGS. 4A and 4B, with both the diode-resistor combination and the MRAM SDT junction, is presented in FIG. 5. Breakdown voltage for the diode in combination with the MRAM SDT junction is indicated at point 501. Generally, the breakdown voltage is designed to be within the available control voltage. As an example, a control voltage of 2.0 volts may have a diode with a designed breakdown voltage possibly in the range of 1.8 volts, plus or minus 100 millivolts. Other values may be employed, and the foregoing is meant as an illustrative example of the control and breakdown voltages that may be encountered. In operation, power is applied for a short duration such that the SDT junction heats up from the combination of self-heating and heat from the application of reverse current to the diode 340a. Power is applied for sufficient duration to reduce the switching coercivity of the data layer 414. The breakdown voltage of the heater is limited by the supply voltage and diode design, but generally speaking, the voltage applied is greater than the breakdown voltage of the diode when arranged with the resistor and magnetic memory element as shown in FIG. 3B. Application of voltage greater than the breakdown voltage causes reverse current to flow through the diode, thereby producing heat and heating the magnetic memory element or SDT junction. The result is a heating of the SDT junction which reduces the switching field and thus facilitates the write process for the magnetic memory element. The positive effect due to the resistance of the SDT junction or magnetic memory element is indicated by a level of self-heating that may exist when voltage and current are applied to the SDT junction.

Regarding levels of voltage and current applied, as well as resistance and diode construction, it is understood to those skilled in the art that the construction of these elements depends on the performance desired. In general, voltage applied in excess of diode breakdown voltage must provide sufficient reverse current to the diode to generate enough heat to heat the magnetic memory element or SDT junction, while being below a value that may cause the voltage breakdown of the magnetic memory element. It should be further noted that the process described herein is reversible in that voltage applied may cause the restoration, or unswitching, of the device.

While the aforementioned and illustrated devices for thermally assisting the write process of an MRAM array of magnetic memory elements or SDT junctions using a series diode has been described in connection with exemplary embodiments, those skilled in the art will understand that many modifications in light of these teachings are possible, and this application is intended to cover any variation thereof. Accordingly, any and all modifications, variations, or equivalent arrangements which may occur to those skilled in the art, should be considered to be within the scope of the present invention as defined in the appended claims.

What is claimed is:

1. An information storage device comprising:
   an array of magnetic memory elements; and
   a plurality of heating elements, each heating element connected in series with one magnetic memory element, each heating element comprising a diode and a resistive element, wherein application of voltage to one magnetic memory element causes reverse current to flow through said diode and resistive element, thereby heating said one magnetic memory element.

2. The device of claim 1, wherein the array of magnetic memory elements comprises an array of spin dependent tunneling (SDT) junctions.

3. The device of claim 1, wherein application of voltage causes selection of one of the magnetic memory elements and one heating element.

4. The device of claim 1, wherein:
each magnetic memory element is connected to one bit line and one word line;
a first end of each heating element is connected to the bit line from an associated magnetic memory element; and
a second end of each heating element is connected to the word line for the associated magnetic memory element.

5. The device of claim 1, wherein said diode comprises a thin film diode.

6. The device of claim 1, wherein all magnetic memory elements in the magnetic memory element array and all heating elements are oriented in a substantially planar orientation.

7. An information storage device comprising:
an array of magnetic memory elements; and
a plurality of heating elements, each heating element comprising a diode and a resistive element, wherein voltage applied to one magnetic memory element and associated heating element causes reverse current to flow through the diode and resistive element, thereby causing current to flow from the diode to one magnetic memory element, thereby heating the one magnetic memory element.

8. The device of claim 7, wherein voltage applied to the heating element is in excess of diode breakdown voltage.

9. The device of claim 7, wherein voltage applied causing reverse current to flow through the diode thereby heating the resistive magnetic memory element is reversible.

10. The device of claim 7, wherein application of voltage to a diode of one heating element in excess of diode breakdown voltage causes selection of an associated magnetic memory element and heat generated by the one heating element.

11. The device of claim 7, wherein:
each magnetic memory element is connected to one bit line and one word line;
a first end of each heating element is connected to the bit line from an associated magnetic memory element; and
a second end of each heating element is connected to the word line for the associated magnetic memory element.

12. The device of claim 7, wherein each diode comprises a thin film diode.

13. The device of claim 7, wherein all magnetic memory elements in the magnetic memory element array and all heating elements are oriented in a substantially planar orientation.

14. The device of claim 7, wherein the array of magnetic memory elements comprises an array of spin dependent tunneling (SDT) junctions.

15. A method for heating an information storage device comprising a plurality of magnetic memory elements, said method comprising:
applying voltage to a heating element connected in series with one magnetic memory element, said heating element comprising a diode and a resistive element;
wherein applying voltage causes reverse current to flow through the diode and the resistive element, thereby heating the one magnetic memory element.

16. The method of claim 15, wherein applying voltage to the heating element comprises applying voltage in excess of diode breakdown voltage.

17. The method of claim 15, wherein applying voltage further causes selection of an associated magnetic memory element and causes the one heating element to produce heat.

18. The method of claim 15, wherein:
each magnetic memory element is connected to one bit line and one word line;
a first end of each heating element is connected to the bit line from an associated magnetic memory element; and
a second end of each heating element is connected to the word line for the associated magnetic memory element.

19. The method of claim 15, wherein each diode comprises a thin film diode.

20. The device of claim 15, wherein the array of magnetic memory elements comprises an array of spin dependent tunneling (SDT) junctions.

21. An information storage device comprising:
an array of spin dependent tunneling (SDT) junctions; and
an associated arrangement of heating elements, each heating element connected in series with one SDT junction, each heating element comprising a diode and a resistive element connected in series, wherein application of voltage to the heating element causes reverse current to flow through the diode and resistive element, thereby heating the SDT junction.

22. The device of claim 21, wherein application of voltage to a diode of one heating element in excess of diode breakdown voltage causes selection of an associated SDT junction and heat generated by the one heating element.

23. The device of claim 22, wherein application of voltage to one SDT junction connected in series with one heating element causes self heating of the one SDT junction in addition to heat generated by the one heating element.

24. The device of claim 21, wherein:
each SDT junction is connected to one bit line and one word line;
a first end of each heating element is connected to the bit line from an associated SDT junction; and
a second end of each heating element is connected to the word line for the associated SDT junction.

25. The device of claim 21, wherein each diode comprises a thin film diode.

26. The device of claim 21, wherein all SDT junctions and all heating elements are oriented in a substantially planar orientation.

27. The device of claim 21, wherein application of voltage resulting in heating the SDT junction is a reversible process.

* * * * *